(12) United States Patent
Makino et al.

(10) Patent No.: US 9,514,771 B2
(45) Date of Patent: Dec. 6, 2016

(54) MAGNETO-RESISTIVE EFFECT ELEMENT WITH RECESSED ANTIFERROMAGNETIC LAYER

(71) Applicant: TDK Corporation, Tokyo (JP)

(72) Inventors: Kenzo Makino, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/672,638

(22) Filed: Mar. 30, 2015

(65) Prior Publication Data
US 2016/0293187 A1    Oct. 6, 2016

(51) Int. Cl.
*G11B 5/39*    (2006.01)
(52) U.S. Cl.
CPC ................ *G11B 5/3912* (2013.01)
(58) Field of Classification Search
None
See application file for complete search history.

(56) References Cited

U.S. PATENT DOCUMENTS

| | | | |
|---|---|---|---|
| 7,324,310 B2* | 1/2008 | Gill | B82Y 25/00 360/324.11 |
| 7,365,949 B2* | 4/2008 | Hayakawa | G11B 5/39 360/324.1 |
| 7,894,166 B2 | 2/2011 | Yamazaki et al. | |
| 7,952,839 B2 | 5/2011 | Yamazaki et al. | |
| 7,961,440 B2* | 6/2011 | Gill | B82Y 10/00 360/324.11 |
| 8,395,867 B2* | 3/2013 | Dimitrov | B82Y 25/00 360/319 |
| 8,582,249 B2* | 11/2013 | Sapozhnikov | G01R 33/093 360/324.11 |
| 8,675,318 B1* | 3/2014 | Ho | G11B 5/398 360/324.11 |
| 8,711,528 B1 | 4/2014 | Xiao et al. | |

(Continued)

FOREIGN PATENT DOCUMENTS

| | | |
|---|---|---|
| JP | 3528511 B2 | 3/2004 |
| JP | 2005-263344 A | 9/2005 |

(Continued)

*Primary Examiner* — Will J Klimowicz
(74) *Attorney, Agent, or Firm* — Posz Law Group, PLC

(57) ABSTRACT

A magneto-resistive effect element has a first shield layer, a second layer, and a multilayer film that is positioned between the first shield layer and the second shield layer. The multilayer film has a free layer, a first pinned layer, a nonmagnetic spacer layer, a second pinned layer that fixes a magnetization direction of the first pinned layer, and an antiferromagnetic layer that is exchange-coupled with the second pinned layer. The antiferromagnetic layer is positioned away from an air bearing surface (ABS). The second pinned layer has a first part that is positioned away from the ABS, and a second part that makes contact with the first part, and that extends to the ABS parallel to the first pinned layer; and the first part has a first layer that makes contact with the antiferromagnetic layer, a second layer that makes contact with the second part, and a layer that is positioned between the first layer and the second layer, and that exchange-couples the first layer and the second layer in an anti-parallel orientation.

13 Claims, 9 Drawing Sheets

(56) References Cited

U.S. PATENT DOCUMENTS

| | | | | |
|---|---|---|---|---|
| 9,042,062 B2* | 5/2015 | Hong | ............... | H01L 43/02 |
| | | | | 360/319 |
| 9,269,382 B1* | 2/2016 | Bertero | ............... | G11B 5/3929 |
| 2004/0207959 A1* | 10/2004 | Saito | ............... | G11B 5/3932 |
| | | | | 360/324.1 |
| 2004/0207960 A1* | 10/2004 | Saito | ............... | G11B 5/3903 |
| | | | | 360/324.1 |
| 2004/0207962 A1* | 10/2004 | Saito | ............... | B82Y 10/00 |
| | | | | 360/324.11 |
| 2009/0086385 A1* | 4/2009 | Gill | ............... | B82Y 10/00 |
| | | | | 360/324.11 |
| 2010/0061020 A1* | 3/2010 | Maslov | ............... | G11B 5/4833 |
| | | | | 360/244.2 |
| 2015/0179195 A1* | 6/2015 | Freitag | ............... | G11B 5/3932 |
| | | | | 360/75 |

FOREIGN PATENT DOCUMENTS

| | | |
|---|---|---|
| JP | 2007-080904 A | 3/2007 |
| JP | 3961497 B2 | 5/2007 |
| JP | 3974587 B2 | 6/2007 |
| JP | 4002909 B2 | 8/2007 |

* cited by examiner

MAGNETO-RESISTIVE EFFECT ELEMENT WITH RECESSED ANTIFERROMAGNETIC LAYER

BACKGROUND OF THE INVENTION

1. Field of the Invention

The present invention relates to a magneto-resistive effect element (MR element), and in particular relates to an MR element where an antiferromagnetic layer that secures the magnetization direction of pinned layers is recessed from an air bearing surface (ABS).

An MR element has a multilayer film inducing a magneto-resistive effect, and two magnetic shield layers between which the multilayer film is disposed in the down track direction (track circumferential direction or a lamination direction of the multilayer film). For such a multilayer film, a spin-valve film is commonly used. The spin-valve film has a free layer that changes its magnetization direction relative to an external magnetic field, a first pinned layer where its magnetization direction is fixed relative to an external magnetic field, and a spacer layer positioned between the free layer and the first pinned layer. The spacer layer is a nonmagnetic layer that causes a magneto-resistive effect. The multilayer film further has a second pinned layer that fixes the magnetization direction of the first pinned layer, and an antiferromagnetic layer that secures the magnetization direction of the second pinned layer. The space between the two magnetic shield layers is referred to as a read gap. In order to enhance the recording density of a magnetic recording medium, particularly the linear recording density in the down track direction, it is effective to reduce the read gap.

U.S. Pat. No. 8,711,528 discloses an MR element where an antiferromagnetic layer is recessed from an ABS. The MR element has an inner shield layer positioned between two magnetic shield layers. The inner shield layer is disposed on the magnetic shield layer adjacent to the antiferromagnetic layer, and faces the ABS. The antiferromagnetic layer makes contact with the back surface of the inner shield layer viewed from the ABS, and does not face the ABS. A first pinned layer extends to the ABS. A second pinned layer has a first part that makes contact with the antiferromagnetic layer, and that is positioned away from the ABS, and a second part that extends to the ABS parallel to the first pinned layer. The first part is a protrusion part that protrudes from the second part toward the antiferromagnetic layer. As a result, the thickness of the second pinned layer varies in the height direction.

In the MR element disclosed in U.S. Pat. No. 8,711,528, since the inner shield layer is disposed on the ABS instead of the antiferromagnetic layer, it is easy to reduce the read gap. This results in improvement of the high-frequency characteristics and the bit error rate, as well. Since the antiferromagnetic layer is away from the ABS, it is difficult for a sense current to pass through the antiferromagnetic layer, and the thermostability of the antiferromagnetic layer is improved. Since the antiferromagnetic layer is away from the ABS, the corrosion resistance of the antiferromagnetic layer is also improved.

In a spin-valve type MR element in general, the magnetization direction of the first pinned layer is fixed in a direction orthogonal to the ABS (hereafter, referred to as the height direction) regardless of the presence of an external magnetic field. A pair of bias layers that apply a bias magnetic field to the free layer is disposed at both sides of the free layers in the cross track direction (the direction that is orthogonal to the down track direction and the height direction) so as to allow the magnetization direction of the free layer to be oriented toward the cross track direction. As a result, when no external magnetic field exists, the magnetization direction of the free layer is ideally orthogonal to that of the first pinned layer. When the external magnetic field is applied to the free layer, the magnetization direction of the free layer rotates. The electrical resistance value of a sense current flowing in the multilayer film varies according to an angle of rotation between the magnetization direction of the free layer and that of the first pinned layer. This is referred to as the magneto-resistive effect. Magnetic information recorded in a magnetic recording medium is read based upon the magneto-resistive effect of the MR element.

The first pinned layer and the second pinned layer are magnetized to an anti-parallel orientation with each other, suppressing the entire magnetization of the layer where these are combined. Preferably, the magnetic film thickness of the first pinned layer and that of the second pinned layer are substantially equalized. The magnetic film thickness is a product of saturation magnetization and film thickness. If the magnetic film thicknesses of the layers are different, the magnetization resistance of the first pinned layer relative to the external magnetic field is decreased. In other words, the magnetization direction of the first pinned layer tends to rotate from the direction orthogonal to the ABS (hereafter, referred to as the height direction) to the cross track direction (down track direction and the direction orthogonal to the height direction).

As described above, in the MR element disclosed in U.S. Pat. No. 8,711,528, the thickness of the second pinned layer varies in the height direction. Consequently, if the magnetic film thickness of the first pinned layer and that of the second pinned layer are matched above the inner shield layer, the magnetic film thickness of the first pinned layer and that of the second pinned layer cannot be matched at a portion where the film thickness is great and that is positioned above the antiferromagnetic layer. As a result, the external magnetic field resistance of the second pinned layer is decreased above the antiferromagnetic layer, and the magnetization direction of the first pinned layer also becomes unstable.

Therefore, the objective of the present invention is to provide an MR element that has a second pinned layer having a film thickness that changes in the height direction, and where the magnetic film thickness of the second pinned layer and that of the first pinned layer can be easily balanced regardless of the position of the height direction.

SUMMARY OF THE INVENTION

The MR element of the present invention has a first shield layer, a second shield layer, and a multilayer film that is positioned between the first shield layer and the second shield layer. The multilayer film has a free layer where its magnetization direction fluctuates relative to an external magnetic field; a first pinned layer positioned closer to the first shield layer than the free layer, and where its magnetization direction is fixed relative to the external magnetic field; a nonmagnetic spacer layer positioned between the free layer and the first pinned layer; a second pinned layer positioned closer to the first shield layer than the first pinned layer, and that fixes the magnetization direction of the first pinned layer; and an antiferromagnetic layer positioned closer to the first shield layer than the second pinned layer, and that is exchange-coupled with the second pinned layer. The antiferromagnetic layer is positioned away from an air bearing surface (ABS). The second pinned layer has a first part that is positioned away from the ABS, and a second part that makes contact with the first part, and that extends to the ABS parallel to the first pinned layer. The first part has a first layer that makes contact with the antiferromagnetic layer, a second layer that makes contact with the second part, and a layer that is positioned between the first layer and the second layer, and that exchange-couples the first layer and the second layer in an anti-parallel orientation.

Since the first part of the second pinned layer is provided with a first layer and a second layer that are exchange-coupled in an anti-parallel orientation, it is easy to suppress magnetization of the entire first part.

Therefore, regardless of the position in the height direction, it is easy to balance between the magnetic film thickness of the second pinned layer and that of the first pinned layer.

The above and other objectives, characteristics and advantages of the present invention shall become clear from explanations that refer to attached drawings where the present invention is illustrated.

DETAILED DESCRIPTION OF THE INVENTION

A magneto-resistive effect element (MR element) relating to an embodiment of the present invention and an embodiment of a magnetic head slider using the MR element are explained with reference to the drawings.

Figure 1:
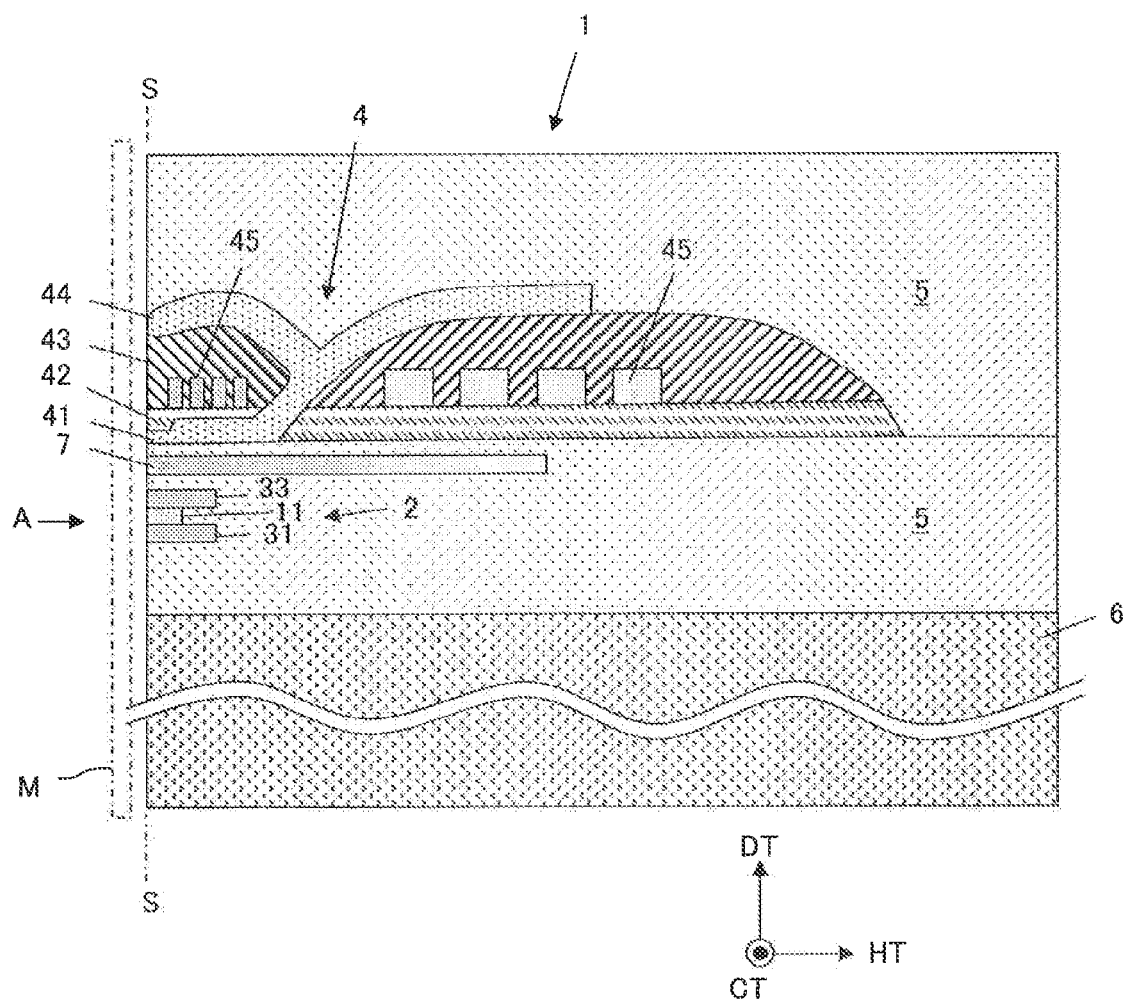
FIG. 1 is a conceptual cross-sectional view of a magnetic head slider relating to one embodiment of the present invention.
Figure 2:
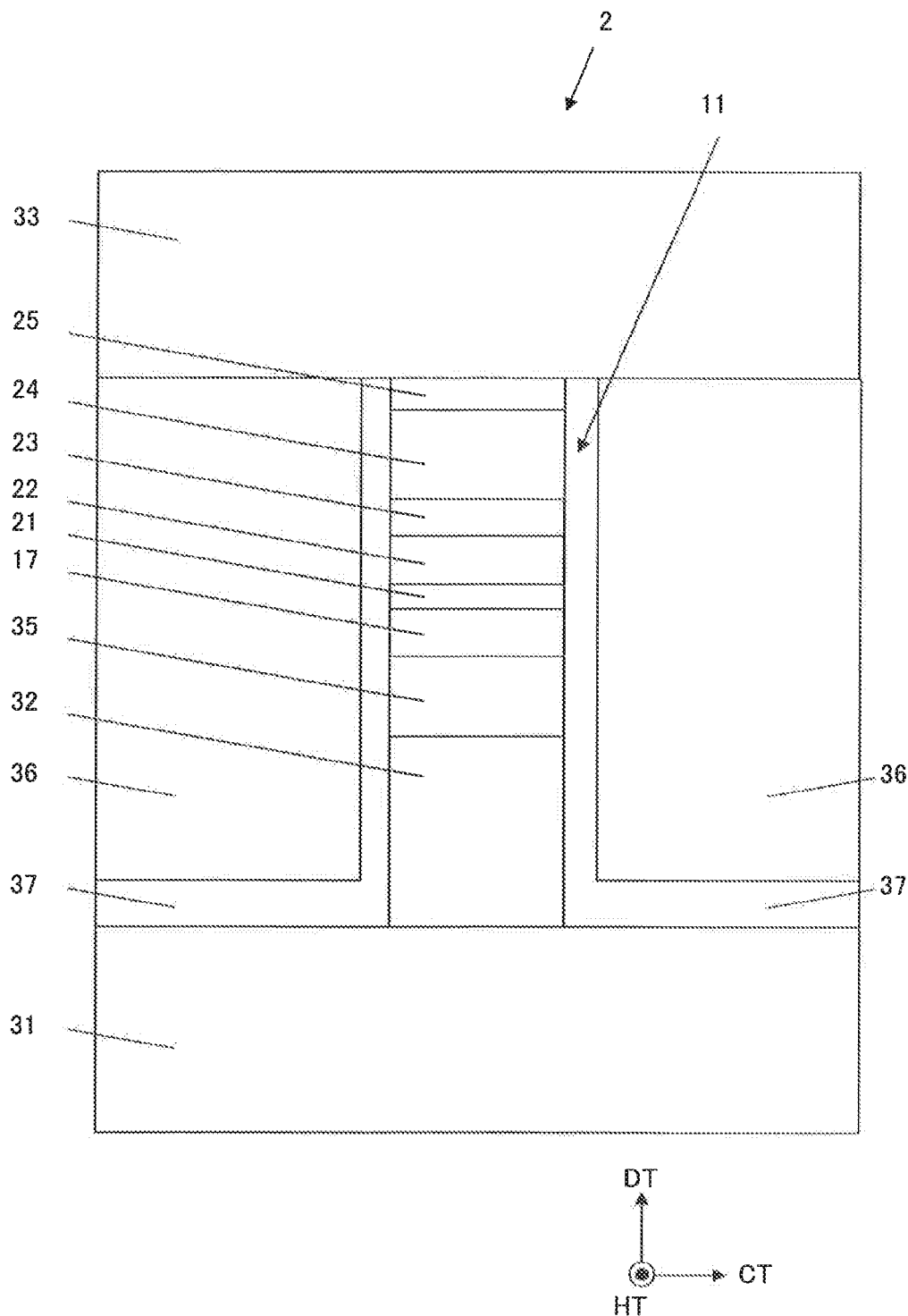
FIG. 2 is a side view of a magneto-resistive effect element viewed from the direction A in FIG. 1.
Figure 3:
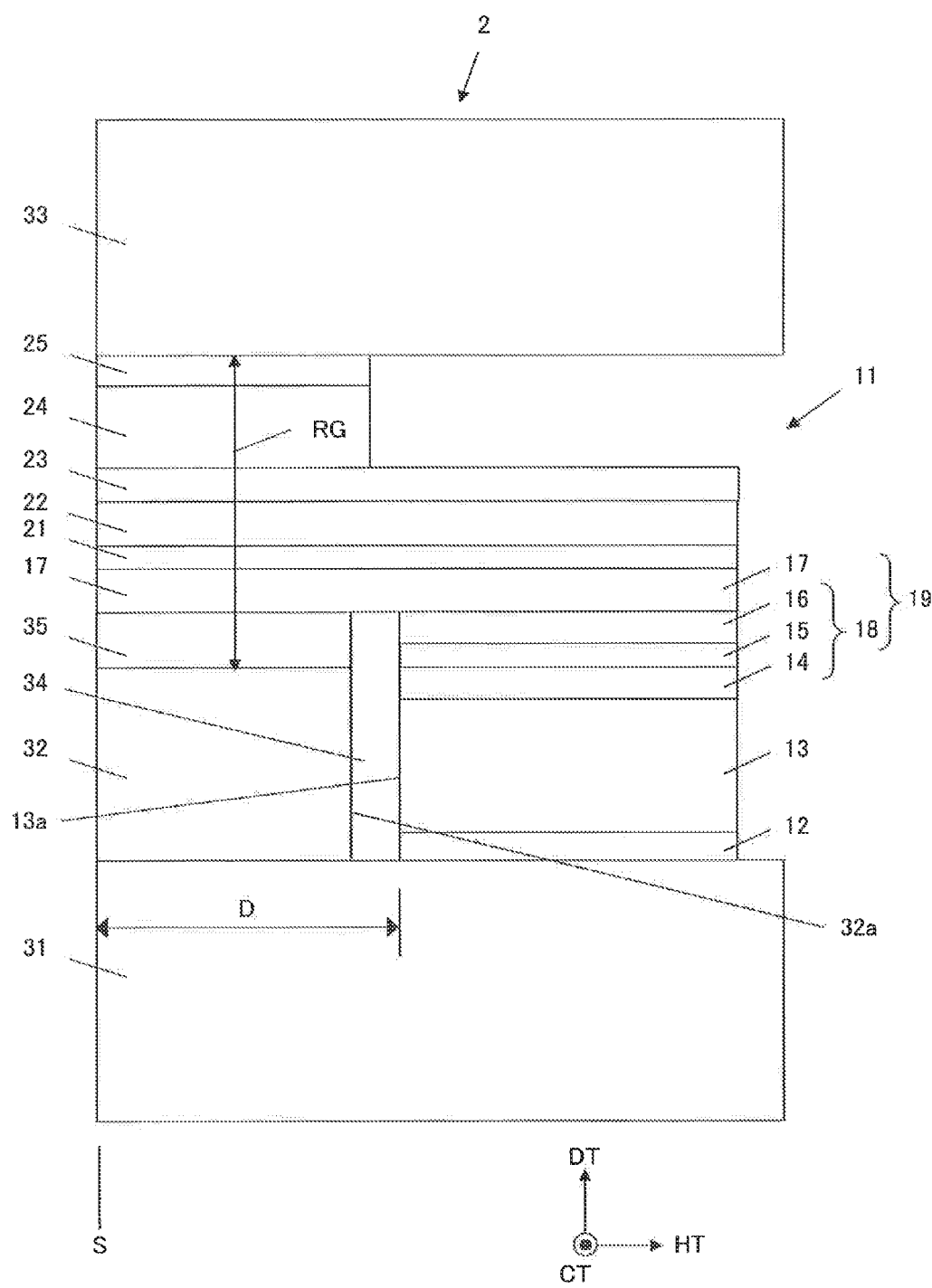
FIG. 3 is a cross-sectional view of the magneto-resistive effect element viewed from the same direction as FIG. 1.

FIG. 1 shows a main portion sectional view of a magnetic slider 1 relating to one embodiment of the present invention. The magnetic slider 1 has a substrate 6, a magneto-resistive effective element (MR element) 2 formed above the substrate 6, and a recording part 4 formed above the substrate 6. FIG. 2 is a side view of the MR element 2 viewed from the direction A in FIG. 1, i.e., shows the configuration of the MR element 2 on an air bearing surface S. FIG. 3 shows a cross-sectional view of the MR element 2 viewed from the same direction as FIG. 1. The air bearing surface S is a surface of the magnetic head slider 1 opposite to a magnetic recording medium (hard disk) M. First, with reference to FIGS. 2 and 3, the configuration of the MR element 2 is explained.

The MR element 2 has a spin-valve type multilayer film 11, a first shield layer 31 and a second shield layer 33 positioned at both sides of the multilayer film 11 relating to the down track direction DT, and a pair of bias layers 36 disposed at both sides of the multilayer film 11 relative to the cross track direction CT. The multilayer film 11 is positioned between the first shield layer 31 and the second shield layer 33. The first shield layer 31 is located closer to the substrate 6 than the second shield layer 33.

The multilayer film 11 has a free layer 24 where its magnetization direction fluctuates relative to an external magnetic field; a first pinned layer 22 where its magnetization direction is fixed relative to the external magnetization; and a spacer layer 23 that is positioned between the free layer 24 and the first pinned layer 22. The free layer 24 and the first pinned layer 22 are made from CoFe, and they may contain Ni. The spacer layer 23 can be formed from various nonmagnetic layers that provide a magneto-resistive effect, such as copper, aluminum oxide, gallium oxide, magnesium oxide or zinc oxide. A protective layer 25 for protecting the multilayer film 11 is formed between the free layer 24 and the second shield layer 33. The protective layer 25 is formed from Ru.

Further, the multilayer film 11 has a second pinned layer 19 that is positioned closer to the first shield layer 31 than the first pinned layer 22, and that fixes the magnetization direction of the first pinned layer 22. The second pinned layer 19 is formed from CoFe. A Ru layer 21 is disposed between the first pinned layer 22 and the second pinned layer 19, and the first pinned layer 22 and a second part 17 (described later) of the second pinned layer 19 are exchange-coupled via the Ru layer 21. The magnetization direction of the first pinned layer 22 is fixed to the antiparallel orientation to the magnetization direction of the second part 17 of the second pinned layer 19 by the Ru layer 21.

Further, the multilayer film 11 has an antiferromagnetic layer 13 that is positioned closer to the first shield layer 31 than the second pinned layer 19, and that is exchange-coupled with the second pinned layer 19. The antiferromagnetic layer 13 faces a back surface 32a of an inner shield layer 32 (described later) viewed from the air bearing surface S, and is not situated on the air bearing surface S. The antiferromagnetic layer 13 is formed from IrMn. The antiferromagnetic layer 13 can be formed from FeMn, NiMn, PtMn or PdPtMn. The second pinned layer 19 makes contact with the antiferromagnetic layer 13, and is magnetized to the height direction HT. A seed layer 12 is disposed between the antiferromagnetic layer 13 and the first shield layer 31. The seed layer 12 is made from a bi-layer film of a Ta layer making contact with the first shield layer 31 and the Ru layer making contact with the antiferromagnetic layer 13. The seed layer 12 is disposed in order to obtain excellent exchange coupling between the antiferromagnetic layer 13 to be laminated onto it and the second pinned layer 19.

The first shield layer 31 and the second shield layer 33 are formed from NiFe (permalloy). The first shield layer 31 and the second shield layer 33 shield an external magnetic field to be emitted from bits that are other than those subject to reading and allow the free layer 24 to detect only the magnetic field to be emitted from the bits subject to reading.

The MR element 2 further has the inner shield layer 32. The inner shield layer 32 is positioned between the first shield layer 31 and the second shield layer 33, and faces the air bearing surface S. The inner shield layer 32 is formed mainly from NiFe, and makes contact with the first shield layer 31. Therefore, the inner shield layer 32 functions as a magnetic shield of the multilayer film 11 along with the first shield layer 31. A read gap RG is regulated as a space between the inner shield layer 32 and the second shield layer 33. In the MR element 2 of the present embodiment, the read gap RG is reduced compared to a conventional MR element where the antiferromagnetic layer 13 is positioned on the air bearing surface S.

IrMn that configures the antiferromagnetic layer 13 tends to be deteriorated by heat, and, the vicinity of the air bearing surface S tends to be at a high temperature because of the flow of the sense current. Since the antiferromagnetic layer 13 of the present embodiment is recessed from the air bearing surface S, it is difficult to be exposed to high temperature due to the current. Further, if the antiferromagnetic layer 13 faces the air bearing surface S, it tends to be corroded. Since the antiferromagnetic layer 13 of the present embodiment is protected by the inner shield layer 32, the reliability of the MR element 2 is improved. In addition, since IrMn that configures the antiferromagnetic layer 13 has a greater particle size, the magnetization direction of the first pinned layer 22 tends to vary among the MR elements. In the present embodiment, since the antiferromagnetic layer 13 and the second pinned layer 19 are exchange-coupled at a location away from the air bearing surface S, it is difficult for the magnetization direction of the first pinned layer 22 to be varied in the vicinity of the air bearing surface S.

The inner shield layer 32 has a greater film thickness (dimensions in the down track direction DT) than the antiferromagnetic layer 13. As a result, the second pinned layer 19 protrudes toward the first shield layer 31 or is recessed at a position opposing the antiferromagnetic layer 13. The second pinned layer 19 has a first part 18, which is a protrusion part, and a flat film-shaped second part 17. The first part 18 faces a back surface 32a of the inner shield layer 32. The second part 17 makes contact with the first part 18 in the down track direction DT, and extends to the air bearing surface S between the first part 18 and the first pinned layer 22, and between the inner shield layer 32 and the first pinned layer 22. The first part 18 is composed of a first layer 14, a Ru layer 15 and a second layer 16. The first layer 14 makes contact with the antiferromagnetic layer 13, and is exchange-coupled with the antiferromagnetic layer 13. The second layer 16 makes contact with the second part 17, and is magnetically integrated with the second part 17. The magnetization direction of the second layer 16 is fixed to orientations that are anti-parallel to that of the first layer 14 by the Ru layer 15. Since the first part 18 has the first layer 14 and the second layer 16, which are magnetized in an anti-parallel orientation with each other, the magnetic moment of the entire first part 18 is suppressed. As long as the magnetization direction of the first layer 14 and that of the second layer 16 can be fixed to the orientation that is anti-parallel with each other, a layer other than Ru can be used, as well. The layer 15 can be formed, for example, from Cr, Cu, Rh, Ir or Re.

It becomes easier to form the spacer layer 23 to be flat by disposing it on the inner shield layer 32. Since it is difficult to form the antiferromagnetic layer 13 from IrMn or the like to be flat in general, flatness of the spacer layer 23 on the antiferromagnetic layer 13 is deteriorated in the track of asperity of the antiferromagnetic layer 13. Since the inner shield layer 32 is formed to be flatter than the antiferromagnetic layer 13, the flatness of the spacer layer 23 on the inner shield layer 32 can be improved.

A cap layer 35 is disposed between the second part 17 of the second pinned layer 19 and the inner shield layer 32. The cap layer 35 is composed of a bi-layer film with a Ta layer making contact with the inner shield layer 32 and a Ru layer making contact with the second pinned layer 19.

A nonmagnetic layer 34 is disposed between the antiferromagnetic layer 13 and the inner shield layer 32, and between the first part 18 of the second pinned layer 19 and the inner shield layer 32. The nonmagnetic layer 34 insulates or weakens magnetic linkage between the first part 18 of the second pinned layer 19 and the inner shield layer 32, and between the antiferromagnetic layer 13 and the inner shield layer 32. When the nonmagnetic layer 34 is electrically non-conductive, generation of magnetic coupling based upon Ruderman Kittel Kasuya Yosida (RKKY) interaction between the first part 18 of the second pinned layer 19 and the inner shield layer 32, or between the antiferromagnetic layer 13 and the inner shield layer 32, is prevented. A flow of a sense current in the antiferromagnetic layer 13 is also suppressed by the nonmagnetic layer 34. As described above, since the antiferromagnetic layer 13 has a low tolerance to heat, suppression of heat generation by the sense current enables enhancement of the reliability of the MR element 2. The nonmagnetic layer 34 can be formed from $Al_2O_3$, $SiO_2$, NiCr, Ru, Ta or MgO. It is preferable that the film thickness of the nonmagnetic layer 34 is approximately 1 nm.

Disposing the nonmagnetic layer 34 between the antiferromagnetic layer 13 and the inner shield layer 32 results in reduction of variations of outputs of the MR element 2 and variations of mean values for asymmetry. The disposition of the nonmagnetic layer 34 also results in reduction of noise of outputs of the MR element 2.

With reference to FIG. 2, a pair of bias layers 36 is formed from CoPt, CoCrPt or the like. The bias magnetic field application layer 36 applies a bias magnetic field to the free layer 24, and magnetizes the free layer 24 into a single magnetic domain. When there is no external magnetic field, the magnetization direction of the free layer 24 is oriented toward the cross track direction CT by the bias magnetic field. A pair of insulating layers 37 for preventing bypass of a sense current are disposed between a pair of the bias magnetic field application layer 36 and the multilayer film 11.

The first shield layer 31 and the second shield layer 33 also function as respective electrodes. A sense current flows into the multilayer film 11 by voltage to be applied between the first shield layer 31 and the second shield layer 33. When an external magnetic field to be emitted from the magnetic recording medium M is applied to the free layer 24, the magnetization direction of the free layer 24 rotates to a predetermined direction by a predetermined angle within the film surface of the free layer 24 according to the orientation and intensity of the external magnetic field. The magnetization direction of the free layer 24 forms a relative angle according to the orientation and the intensity of the external magnetic field relative to the magnetization direction of the first pinned layer 22, spin-dependent scattering of conductive electrons changes according to the relative angle, and a magneto-resistive change is generated.

A magnetic field from the magnetic recording medium M at a position opposite to the multilayer film 11 changes as the magnetic recording medium M rotates. A change of the magnetic field is detected as a change of an electrical resistance of the sense current based upon the magneto-resistive effect. The MR element 2 reads magnetic information that has been written into the magnetic recording medium M utilizing this principle.

The multilayer film 11 can be made using a conventional method such as sputtering. With reference to FIGS. 4A to 4E, a method for making the multilayer film 11 is described.

Figure 4A:
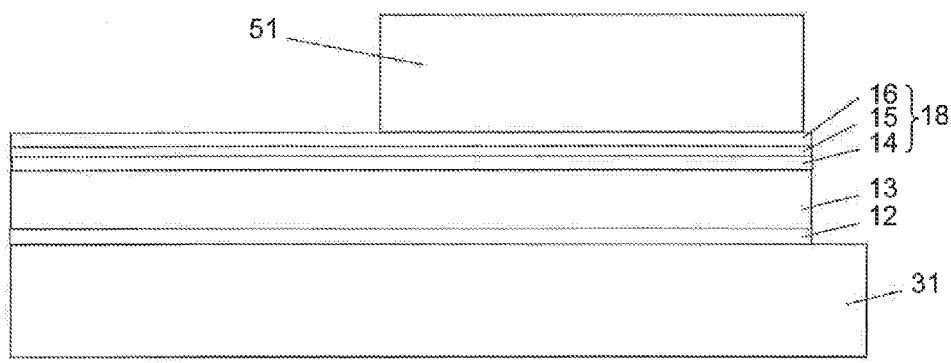
FIGS. 4A to 4E are conceptual diagrams for explaining a method for manufacturing a magneto-resistive effect element (MR element)

First, as shown in FIG. 4A, the first shield layer 31 is made using a plating method, and a seed layer 12, the antiferromagnetic layer 13, and the first part 18 of the second pinned layer 19 are sequentially formed on the first shield layer 31 using a sputtering method. Next, a photoresist 51 is made on the first part 18 of the second pinned layer 19. The photoresist 51 will not be disposed in a region where the inner shield layer 32 is made.

Figure 4B:
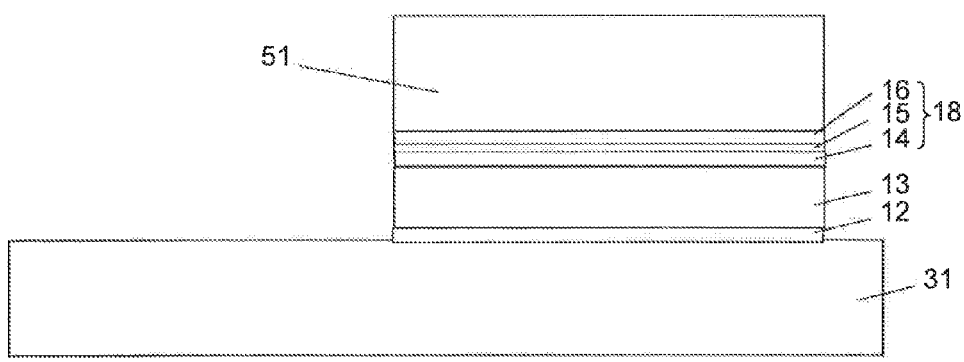

Next, as shown in FIG. 4B, the seed layer 12, the antiferromagnetic layer 13 and the first part 18 of the second pinned layer 19 are removed by ion milling. Portions of these layers covered with the photoresist 51 are not removed.

Figure 4C:
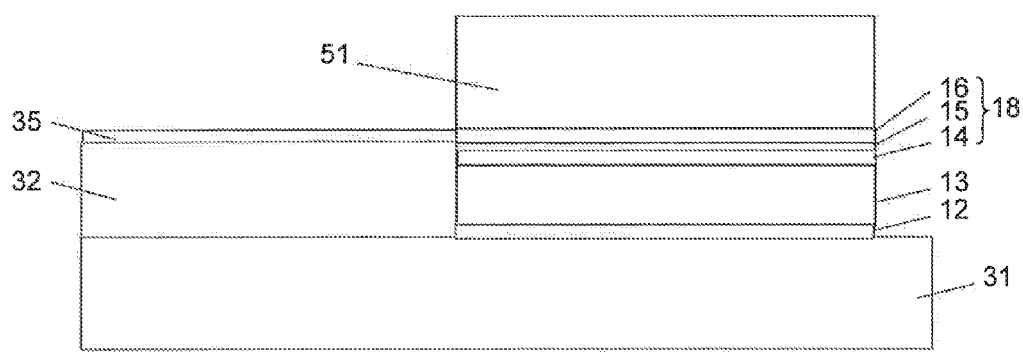

Next, as shown in FIG. 4C, the inner shield layer 32 and the cap layer 35 are formed by the sputtering method. The inner shield layer 32 makes contact with the first shield layer 31, and is integrated with the first shield layer 31.

Figure 4D:
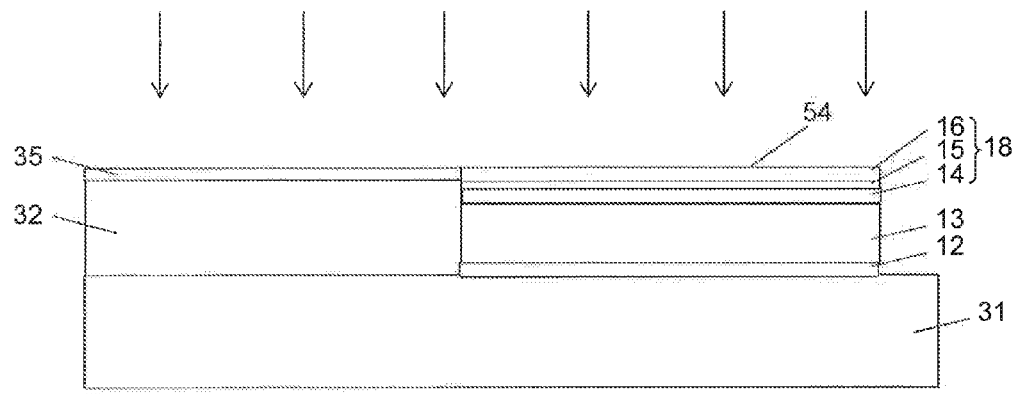

Next, as shown in FIG. 4D, the photoresist 51 is removed, and a surface 54 of the cap layer 35 and the first part 18 of the second pinned layer 19 are planarized by ion milling. Consequently, the second part 17 of the second pinned layer 19, the first pinned layer 22 and the spacer layer 23 to be formed on the surface 54 can be formed to be flat.

Figure 4E:
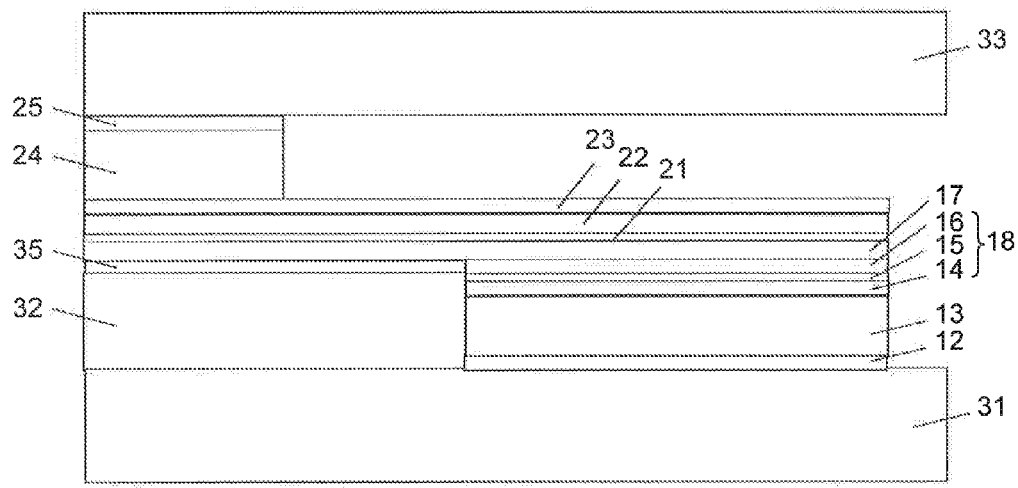

Next, as shown in FIG. 4E, the second part 17 of the second pinned layer 19 is formed on the cap layer 35 and the first part 18 of the second pinned layer 19 by a sputtering method. The second part 17 of the second pinned layer 19 makes contact with the second layer 16 of the first part 18, and is integrated with the second layer 16. Then, the Ru layer 21, the first pinned layer 22, the spacer layer 23, the free layer 24 and the protective layer 25 are formed by the sputtering method, and the second shield layer 33 is formed by a plating method.

With reference to FIG. 1 again, a recording part 4 is disposed above the multilayer film 11 via an interelement shield layer 7 formed by a sputtering method. The recording part 4 has a configuration for so-called perpendicular magnetic recording. A magnetic pole layer for writing is composed of a main magnetic pole layer 41 and an auxiliary magnetic pole layer 44. These magnetic pole layers are formed by a frame plating method. The main magnetic pole layer 41 is formed from an alloy composed of any two or three of Ni, Fe and Co, and extends in the height direction HT. A coil layer 45 extending on the gap layer 42 made from an insulating material is wound around the periphery of the main magnetic pole layer 41. The coil layer 45 is formed by a frame plating method. A magnetic flux is induced to the main magnetic pole layer 41 by the coil layer 45. This magnetic flux is guided inside the main magnetic pole layer 41, and is emitted toward the magnetic recording medium M from the air bearing surface S. The auxiliary magnetic pole layer 44 is a magnetic layer that is magnetically coupled with the main magnetic pole layer 41. The auxiliary magnetic pole layer 44 is formed from an alloy made of any two or three of Ni, Fe and Co. The auxiliary magnetic pole layer 44 is disposed by branching from the main magnetic pole layer 41, and is opposite to the main magnetic pole layer 41 on the air bearing surface S via the gap layer 42 and the coil insulating layer 43.

The free layer 24 and the first pinned layer 22 can be disposed upside-down in the down track direction DT relative to the spacer layer 23. Specifically, the free layer 24, the spacer layer 23, the first pinned layer 22, the second pinned layer 19 and the antiferromagnetic layer 13 can be laminated from the first shield layer 31 toward the second shield layer 33 in this order. The inner shield layer 32 makes contact with the second shield layer 33, and the antiferromagnetic layer 13 is isolated from the air bearing surface S via the inner shield layer 32.

Figure 5A:
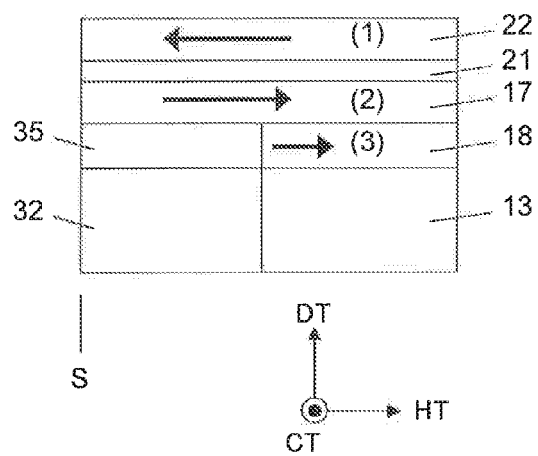
FIGS. 5A to 5D are conceptual diagrams showing the configuration and magnetic film thickness of the second pinned layer.

FIG. 5A illustrates a first pinned layer and a second pinned layer of the MR element (comparative example) disclosed in U.S. Pat. No. 8,711,528. In FIG. 5A, as a matter of practical convenience, the first pinned layer 22 is indicated with the symbol (1), the second part 17 of the second pinned layer 19 is indicated with the symbol (2) and the first part 18 of the second pinned layer 19 is indicated with the symbol (3). The first part 18 of the second pinned layer 19 has a single layer configuration. The arrows in the diagram indicate respective magnetization directions. The first pinned layer 22 is magnetized to the left orientation in the height direction HT, and the first part 18 of the second pinned layer 19 is magnetized to the right orientation in the height direction HT. Since the second part 17 of the second pinned layer 19 is integrated with the first part 18, as similar to the first part 18, it is magnetized to the right orientation in the height direction HT.

Figure 5B:
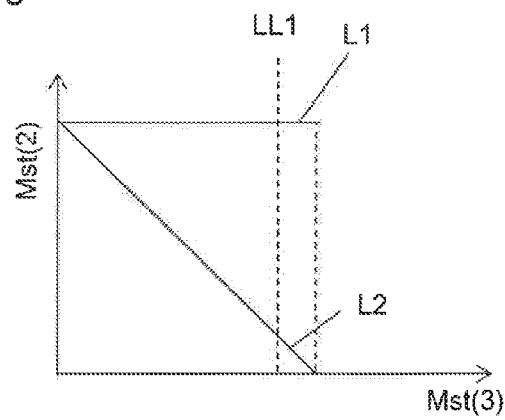

FIG. 5B shows the relationship between magnetic film thickness $Mst(2)$ of the second part 17 of the second pinned layer 19 and magnetic film thickness $Mst(3)$ of the first part 18. The magnetic film thickness is a product of saturation magnetization and the film thickness. It is preferable that the magnetic film thickness of the first pinned layer 22 and that of the second pinned layer 19 are substantially matched on the inner shield layer 32 including the air bearing surface S. This results in stabilization of the magnetization direction of the first pinned layer 22 relative to an external magnetic field, and tolerability of the first pinned layer 22 relative to the external magnetic field can be improved. The second pinned layer 19 has only the second part 17 on the inner shield layer 32. Therefore, on the inner shield layer 32, it is desirable that the magnetic film thickness $Mst(1)$ of the first pinned layer 22 and the magnetic film thickness $Mst(2)$ of the second part 17 of the second pinned layer 19 are matched. In other words, it is desirable that the relationship of $Mst(1)=Mst(2)$ holds. This relationship is unrelated to the magnetic film thickness $Mst(3)$ of the first part 18 of the second pinned layer 19. The relationship between $Mst(2)$ and $Mst(3)$ is indicated with a line L1 in FIG. 5B.

In the meantime, the first part 18 of the second pinned layer 19 further exists on the antiferromagnetic layer 13. In order to balance the magnetic film thickness on the antiferromagnetic layer 13, it is desirable that the magnetic film thickness $Mst(1)$ of the first pinned layer 22 is matched with a sum of the magnetic film thickness $Mst(2)$ of the second part 17 of the second pinned layer 19 and the magnetic film thickness $Mst(3)$ of the first part 18. In other words, it is desirable that the relationship of $Mst(1)=Mst(2)+Mst(3)$ holds. The relationship between $Mst(2)$ and $Mst(3)$ is indicated with the line L2 in FIG. 5B.

The first part 18 of the second pinned layer 19 has the function of protecting the antiferromagnetic layer 13. The performance of the antiferromagnetic layer 13 to fix the magnetization direction of the second pinned layer 19 is decreased under the influence of the ion milling. In other words, unidirectional anisotropy of the antiferromagnetic layer 13 is decreased under the influence of the ion milling. In the process of the ion milling explained with reference to FIG. 4D, since the photoresist 51 is removed, the ion milling have an influence on the antiferromagnetic layer 13. It is desirable that the first part 18 of the second pinned layer 19 has a film thickness enabling the protection of the antiferromagnetic layer 13. The magnetic film thickness corresponding to the minimum film thickness for that purpose is indicated with LL1 in FIG. 5B.

In order to balance the magnetic film thickness both on the inner shield layer 32 and on the antiferromagnetic layer 13, it is necessary to simultaneously satisfy the relationships between the line L1 and the line L2. Further, the first part 18 of the second pinned layer 19 needs to have the minimum magnetic film thickness indicated with LL1. However, Mst (3) that satisfies all of these conditions does not exist.

Figure 5C:
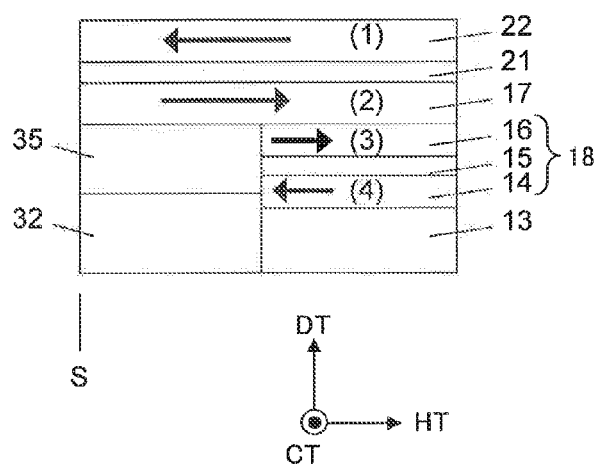

FIG. 5C illustrates the first pinned layer and the second pinned layer of the MR element 2 in the present embodiments shown in FIGS. 2 and 3. As described above, the first part 18 of the second pinned layer 19 is composed of the first layer 14, the Ru layer 15 and the second layer 16. The first layer 14 and the second layer 16 are exchange-coupled via the Ru layer 15, and are magnetized to the antiparallel orientation. Therefore, the first pinned layer 22 and the first layer 14 are magnetized to the left orientation in the height direction HT, and the second layer 16 of the first part 18 of the second pinned layer 19 and the second part 17 are magnetized to the right orientation in the height direction HT. In FIG. 5C, as a matter of practical convenience, the first pinned layer 22 is indicated with the symbol (1), the second part 17 of the second pinned layer 19 is indicated with the symbol (2), the second layer 16 of the first part 18 of the second pinned layer 19 is indicated with the symbol (3) and the first layer 14 of the first part 18 is indicated with the symbol (4).

Figure 5D:
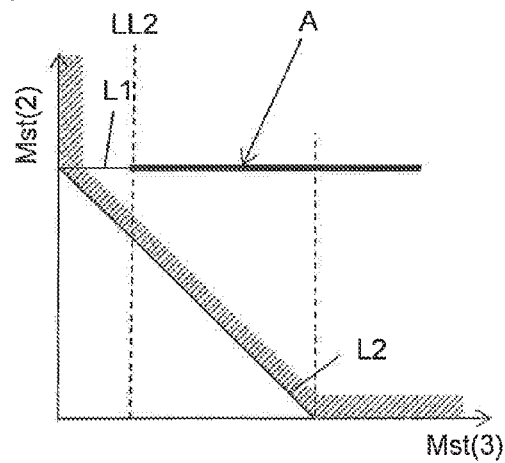

FIG. 5D shows the relationship between the magnetic film thickness Mst(2) of the second part 17 of the second pinned layer 19 and the magnetic film thickness Mst(3) of the second layer 16 of the first part 18. As described above, on the inner shield layer 32, it is desirable that the magnetic film thickness Mst(1) of the first pinned layer 22 and the magnetic film thickness Mst(2) of the second part 17 of the second pinned layer 19 are matched. In other words, it is desirable that the relationship of Mst(1)=Mst(2) holds. This relationship is unrelated to the magnetic film thickness Mst(3) of the first part 18 of the second pinned layer 19. The relationship between Mst(2) and Mst(3) is indicated with the line L1 in FIG. 5D.

In order to balance the magnetic film thickness on the antiferromagnetic layer 13, it is desirable that the relationship of Mst(1)+Mst(4)=Mst(2)+Mst(3) holds. This relationship is satisfied within the hatched range in FIG. 5D.

The first part 18 of the second pinned layer 19 has the function of protecting the antiferromagnetic layer 13 as described above. Since the Ru layer 15 has the superior protective performance to the first layer 14 and the second layer 16 that are formed with CoFe, the film thickness of the first part 18 can be smaller compared to the comparative example. However, if the second layer 16 is thin, the Ru layer 15 is mixed with the second layer 16, and it affects the exchange coupling performance of the Ru layer 15. Consequently, it is desirable that the second layer 16 of the first part 18 of the second pinned layer 19 has a film thickness that enables the Ru layer 15 to be protected. The minimum film thickness of the second layer 16 is preferably 0.8 nm, and the magnetic film thickness corresponding to this is indicated with LL2 in the FIG. 5D. LL2 can be smaller than LL1.

These three relationships: Mst(1)=Mst(2), Mst(1)+Mst(4)=Mst(2)+Mst(3) and Mst(3)≥LL2 are satisfied with the range A in FIG. 5D.

Consequently, since the first part 18 of the second pinned layer 19 has the first layer 14, the Ru layer 15 and the second layer 16, the magnetic film thickness of the second pinned layer 19 and the first pinned layer 22 can be easily balanced on the inner shield layer 32 and the antiferromagnetic layer 13.

As it is understood from the description, it is ideally preferable that the relationships of Mst(1)+Mst(4)=Mst(2)+Mst(3), Mst(1)=Mst(2) and Mst(3)=Mst(4) hold. However, it is not always necessary that these relationships hold, and any difference between Mst(1)+Mst(4) and Mst(2)+Mst(3) and the difference between Mst(1) and Mst(2) should be as small as possible. For example, the value where the magnetic film thickness Mst(1) of the first pinned layer 22 is subtracted from the magnetic film thickness Mst(2) of the second part 17 of the second pinned layer 19, Mst(2)−Mst (1), can be within the range of $-0.3 \times 10^{-3}$ [A] ($-0.3 \times 10^{-4}$ [emu/cm$^2$]) or greater and $1.6 \times 10^{-3}$ [A] ($1.6 \times 10^{-4}$ [emu/cm$^2$]) or less. Setting of the magnetic film thickness Mst(1) and Mst(2) so as to satisfy this condition enables the linearity of the MR ratio to be easily adjusted. For the similar purpose, the value where the magnetic film thickness Mst(3) of the second layer 16 is subtracted from the magnetic film thickness Mst(4) of the first layer 14, Mst(4)−Mst(3), can be within the range of $-0.3 \times 10^{-33}$ [A] ($-0.3 \times 10^{-4}$ [emu/cm$^2$]) or greater and $1.6 \times 10^{-3}$ [A] ($1.6 \times 10^{-4}$ [emu/cm$^2$]) or less.

In addition, in order to prevent the reduction of the adherence strength of the first pinned layer, it is desirable that a total sum of the magnetic film thickness of the first pinned layer 22 and that of the second pinned layer 19, Mst(1)+Mst(2)+Mst(3)+Mst(4), is $1.35 \times 10^{-2}$ [A] ($1.35 \times 10^{-3}$ [emu/cm$^2$]) or less.

Figure 6A:
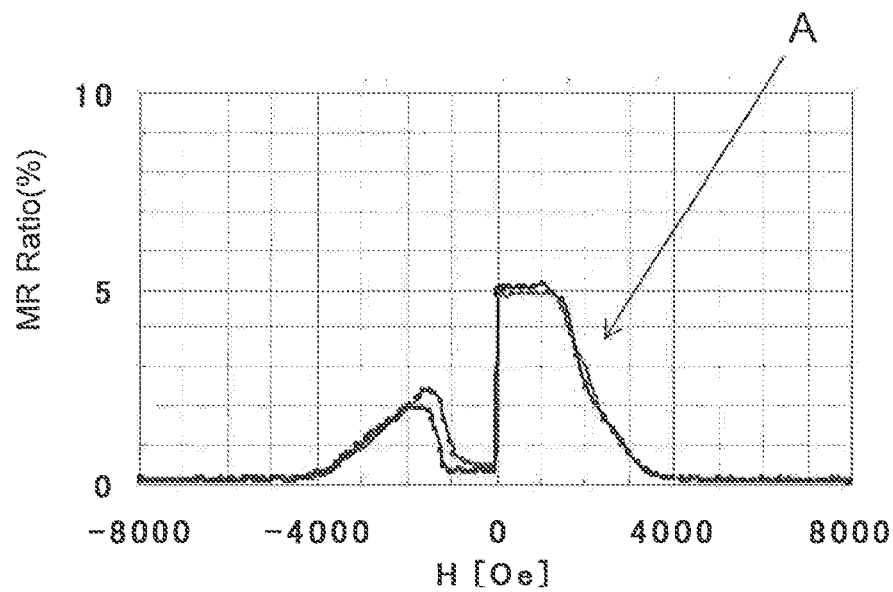
FIGS. 6A to 6B show the relationship between an external magnetic field and an MR ratio in comparative examples and embodiments.
Figure 6B:
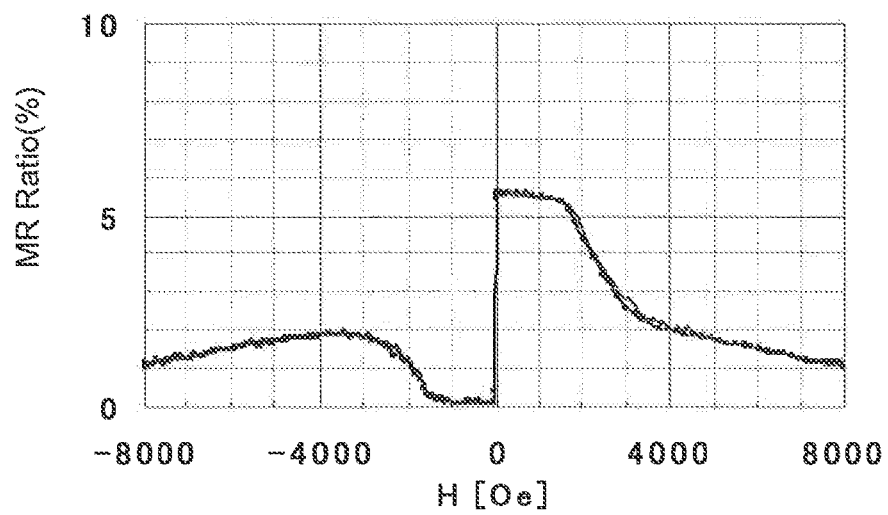

FIG. 6A shows the relationship between an external magnetic field and the MR ratio of a comparative example shown in FIG. 5A, and FIG. 6B shows the relationship between an external magnetic field and the MR ratio of an embodiment shown in FIG. 5C. The MR ratio is an index indicating the magnitude of a magneto-resistive effect. In the comparative example shown in FIG. 6A, as indicated with A, the MR ratio at the time of application of a great magnetic field is greatly decreased. In the embodiment shown in FIG. 6B, such a great reduction of the MR ratio is not observed. In the comparative example, it is inferred that the adherence strength of the second pinned layer and the first pinned layer is reduced, and the magnetization direction of the first pinned layer becomes unstable.

Figure 7:
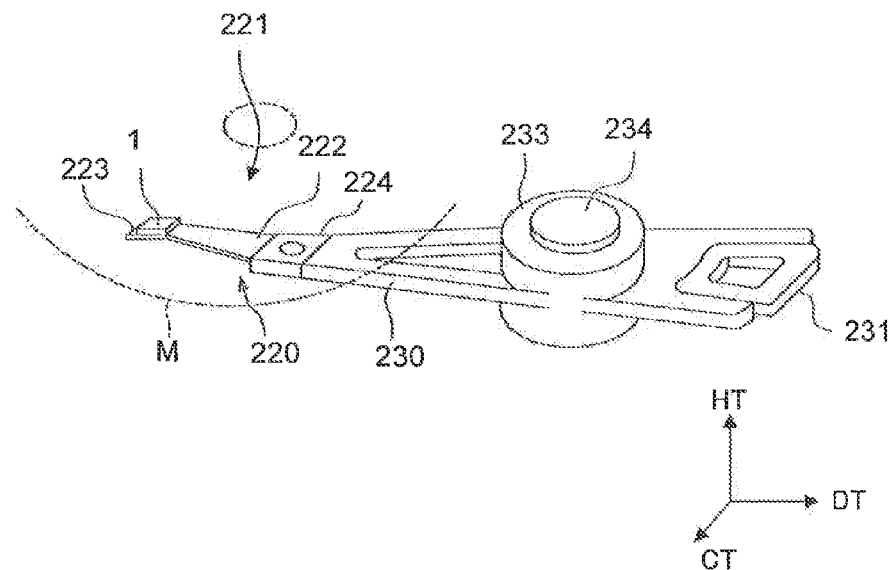
FIG. 7 is a perspective view of a head arm assembly of the present invention.

FIG. 7 is a perspective view of a head gimbal assembly (HGA) 221. The HGA 221 is provided with the magnetic head slider 1 where the MR element 2 is mounted, and a suspension 220 that elastically supports the magnetic head slider 1. The suspension 220 has a plate-spring-state load beam 222 formed from stainless steel, a flexure 223 disposed at one end part of the load beam 22, and a base plate 224 disposed at the other end part of the load beam 222. The magnetic slider 1 is joined to the flexure 223, and has a moderate degree of freedom is provided by the flexure 223. A gimbal part (not shown) to maintain the posture of the magnetic head slider 1 constant is disposed at a portion where the magnetic slider 1 is attached to the flexure 223.

The HGA 221 is attached to an arm 230. The arm 230 moves the magnetic head slider 1 in the cross track direction CT. The base plate 224 is attached to one end of the arm 230. A coil 231 that is a part of a voice coil motor is attached to the other end portion of the arm 230. A bearing 233 is disposed at the intermediate part of the arm 230. The arm 230 is pivotably supported by a shaft 234 mounted to the bearing 233. The arm 230 and the voice coil motor that drives the arm 230 configure an actuator.

Figure 8:
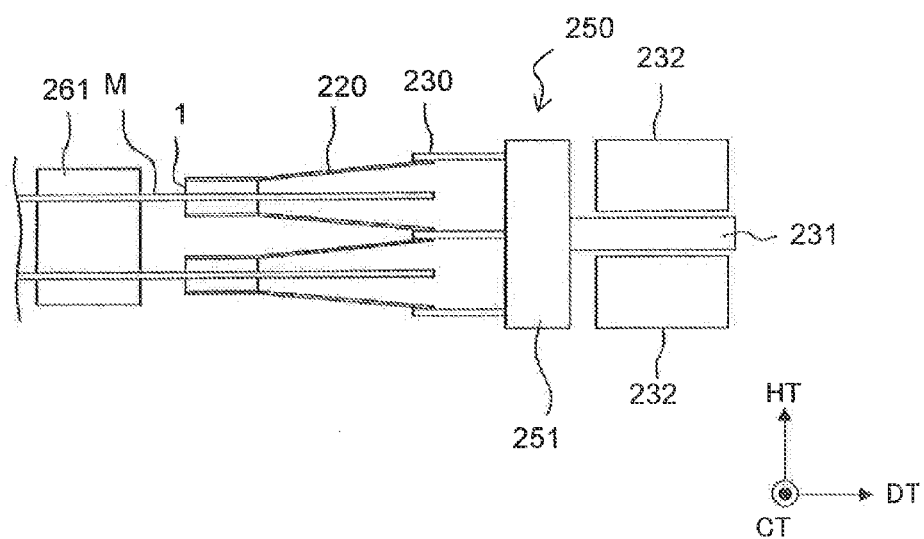
FIG. 8 is a side view of a head stack assembly of the present invention.

FIG. 8 is a side view of a head stack assembly 250. The head stack assembly 250 has a carriage 251 having a plurality of arms 230, and HGAs 221 respectively attached to each of the arm 230, respectively. The HGAs 221 are mounted to the arms 230 so as to align at intervals from each other in the height direction HT. A pair of permanent magnets 232 are arranged at opposing positions across the coil 231.

Figure 9:
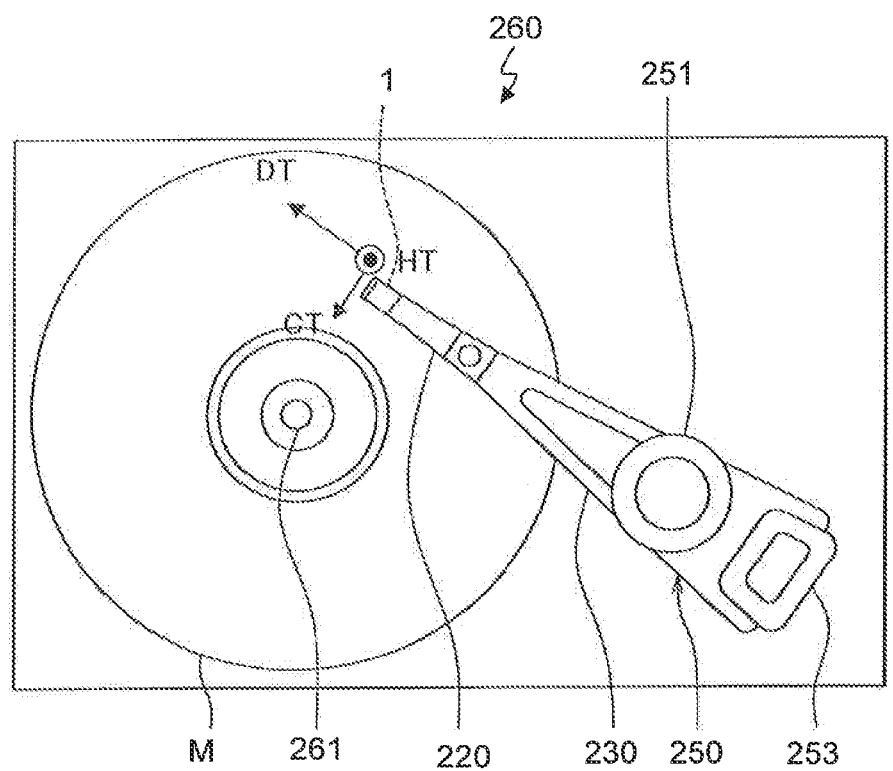
FIG. 9 is a plan view of a magnetic recording apparatus of the present invention.

FIG. 9 is a plan view of a magnetic recording apparatus. The head stack assembly 250 is incorporated into a magnetic recording apparatus 260. The magnetic recording apparatus 260 has a plurality of magnetic recording media M attached to a spindle motor 261. Two magnetic head sliders 1 opposite to each other across the magnetic recording medium M are arranged in each magnetic recording medium M. The head stack assembly 250 except for the magnetic head sliders 1 and the actuator configure a positioning device, support the magnetic head sliders 1, and position the magnetic head sliders 1 relative to the magnetic recording media M. The magnetic head sliders 1 are moved to the cross track direction CT of the magnetic recording medium M by the actuator, and are positioned relative to the magnetic recording media M. The magnetic head sliders 1 record information into the magnetic recording media M by the magnetic recording element, and reproduce the information recorded in the magnetic recording medium M by the MR element 2.

Although the preferred embodiments of the present invention were presented and explained in detail, it should be understood that they may be modified or varied as long as they do not depart from the concept or the scope of the attached claims.

What is claimed is:

1. A magneto-resistive effect element (MR element), comprising:
    a first shield layer,
    a second shield layer, and
    a multilayer film positioned between the first shield layer and the second shield layer, wherein
    the multilayer film comprises:
        a free layer having a magnetization direction that fluctuates relative to an external magnetic field,
        a first pinned layer that is positioned closer to the first shield layer than the free layer, and having a magnetization direction that is fixed relative to the external magnetic field,
        a nonmagnetic spacer layer that is positioned between the free layer and the first pinned layer,
        a second pinned layer positioned closer to the first shield layer than the first pinned layer, and that fixes the magnetization direction of the first pinned layer, and
        an antiferromagnetic layer that is positioned closer to the first shield layer than the second pinned layer, and that is exchange-coupled with the second pinned layer;
    the antiferromagnetic layer is positioned away from an air bearing surface (ABS);
    the second pinned layer comprises:
        a first part that is positioned away from the ABS, and
        a second part that makes contact with the first part, and that extends to the ABS parallel to the first pinned layer, and
    the first part comprises:
        a first layer that makes contact with the antiferromagnetic layer,
        a second layer that makes contact with the second part, and
        a layer that is positioned between the first layer and the second layer, and that exchange-couples the first layer and the second layer in anti-parallel orientation,
    wherein
    a value of a magnetic film thickness of the first pinned layer subtracted from a magnetic film thickness of the second part of the second pinned layer is within a range of $-0.3 \times 10^{-3}$ [A] or greater and $1.6 \times 10^{-3}$ [A] or less.

2. The MR element according to claim 1, wherein the magnetic film thickness of the second part of the second pinned layer and that of the first pinned layer are equal.

3. The MR element according to claim 1, wherein the film thickness of the second layer is 0.8 nm or greater.

4. The MR element according to claim 1, further comprising:
    an inner shield layer that is positioned between the first shield layer and the second shield layer, that makes contact with the first shield layer, and that faces the ABS, and
    a non-magnetic layer that is positioned between the antiferromagnetic layer and the inner shield layer.

5. A head gimbal assembly (HGA), comprising:
    a magnetic head slider comprising the MR element according to claim 1, and
    a suspension that elastically supports the magnetic head slider, wherein the suspension comprises:
        a flexure joined to the magnetic head slider,
        a load beam having one end connected to the flexure, and
        a base plate that is connected to the other end of the load beam.

6. A magnetic recording apparatus, comprising:
    a magnetic head slider comprising the MR element according to claim 1,
    a magnetic recording medium that is positioned opposite to the magnetic head slider,
    a spindle motor that rotary-drives the magnetic recording medium, and
    a device that supports the magnetic head slider, and that positions the magnetic head slider relative to the magnetic recording medium.

7. A magneto-resistive effect element (MR element), comprising:
    a first shield layer,
    a second shield layer, and
    a multilayer film positioned between the first shield layer and the second shield layer, wherein
    the multilayer film comprises:
        a free layer having a magnetization direction that fluctuates relative to an external magnetic field,
        a first pinned layer that is positioned closer to the first shield layer than the free layer, and having a magnetization direction that is fixed relative to the external magnetic field,
        a nonmagnetic spacer layer that is positioned between the free layer and the first pinned layer,
    a second pinned layer positioned closer to the first shield layer than the first pinned layer, and that fixes the magnetization direction of the first pinned layer, and an antiferromagnetic layer that is positioned closer to the first shield layer than the second pinned layer, and that is exchange-coupled with the second pinned layer;
the antiferromagnetic layer is positioned away from an air bearing surface (ABS);
the second pinned layer comprises:
a first part that is positioned away from the ABS; and
a second part that makes contact with the first part, and that extends to the ABS parallel to the first pinned layer, and
the first part comprises:
a first layer that makes contact with the antiferromagnetic layer,
a second layer that makes contact with the second part, and
a layer that is positioned between the first layer and the second layer, and that exchange-couples the first layer and the second layer in anti-parallel orientation,
wherein
a value of a magnetic film thickness of the second layer subtracted from that of the first layer is within the range of $-0.3 \times 10^{-3}$ [A] or greater and $1.6 \times 10^{-3}$ [A] or less.

8. The MR element according to claim 7, wherein the magnetic film thickness of the first layer and that of the second layer are equal.

9. The MR element according to claim 7, wherein the film thickness of the second layer is 0.8 nm or greater.

10. The MR element according to claim 7, further comprising:
an inner shield layer that is positioned between the first shield layer and the second shield layer, that makes contact with the first shield layer, and that faces the ABS, and
a non-magnetic layer that is positioned between the antiferromagnetic layer and the inner shield layer.

11. A head gimbal assembly (HGA), comprising:
a magnetic head slider comprising the MR element according to claim 7, and
a suspension that elastically supports the magnetic head slider, wherein the suspension comprises:
a flexure joined to the magnetic head slider,
a load beam having one end connected to the flexure, and
a base plate that is connected to the other end of the load beam.

12. A magnetic recording apparatus, comprising:
a magnetic head slider comprising the MR element according to claim 7,
a magnetic recording medium that is positioned opposite to the magnetic head slider,
a spindle motor that rotary-drives the magnetic recording medium, and
a device that supports the magnetic head slider, and that positions the magnetic head slider relative to the magnetic recording medium.

13. A magneto-resistive effect element (MR element), comprising:
a first shield layer,
a second shield layer, and
a multilayer film positioned between the first shield layer and the second shield layer, wherein
the multilayer film comprises:
a free layer having a magnetization direction that fluctuates relative to an external magnetic field,
a first pinned layer that is positioned closer to the first shield layer than the free layer, and having a magnetization direction that is fixed relative to the external magnetic field,
a nonmagnetic spacer layer that is positioned between the free layer and the first pinned layer,
a second pinned layer positioned closer to the first shield layer than the first pinned layer, and that fixes the magnetization direction of the first pinned layer, and
an antiferromagnetic layer that is positioned closer to the first shield layer than the second pinned layer, and that is exchange-coupled with the second pinned layer,
the antiferromagnetic layer is positioned away from an air bearing surface (ABS);
the second pinned layer comprises:
a first part that is positioned away from the ABS, and
a second part that makes contact with the first part, and that extends to the ABS parallel to the first pinned layer, and
the first part comprises:
a first layer that makes contact with the antiferromagnetic layer,
a second layer that makes contact with the second part, and
a layer that is positioned between the first layer and the second layer, and that exchange-couples the first layer and the second layer in anti-parallel orientation,
wherein
a total sum of a magnetic film thickness of the first pinned layer and that of the second pinned layer is $1.35 \times 10^{-2}$ [A] or less.

* * * * *